(12) United States Patent
Roberts (10) Patent No.: US 10,095,421 B2
(45) Date of Patent: Oct. 9, 2018

(54) HYBRID MEMORY MODULE BRIDGE NETWORK AND BUFFERS

(71) Applicant: Advanced Micro Devices, Inc., Sunnyvale, CA (US)

(72) Inventor: David A. Roberts, Cambridge, MA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 20 days.

(21) Appl. No.: 15/331,582

(22) Filed: Oct. 21, 2016

(65) Prior Publication Data

US 2018/0113628 A1    Apr. 26, 2018

(51) Int. Cl.
*G06F 3/00* (2006.01)
*G06F 3/06* (2006.01)
*G11C 7/10* (2006.01)

(52) U.S. Cl.
CPC .......... *G06F 3/0611* (2013.01); *G06F 3/0659* (2013.01); *G06F 3/0685* (2013.01); *G11C 7/1072* (2013.01)

(58) Field of Classification Search
None
See application file for complete search history.

(56) References Cited

U.S. PATENT DOCUMENTS

| | | | |
|---|---|---|---|
| 5,272,664 A | | 12/1993 | Alexander et al. |
| 5,473,770 A | * | 12/1995 | Vrba ................... G06F 11/1666 365/222 |
| 5,504,700 A | | 4/1996 | Insley et al. |

(Continued)

FOREIGN PATENT DOCUMENTS

| | | |
|---|---|---|
| DE | 112004000821 T5 | 5/2006 |
| JP | 2001331439 A | 11/2001 |

(Continued)

OTHER PUBLICATIONS

Office Action in Japanese Patent Application No. 2009-535285, dated Feb. 27, 2013, 4 pages.

(Continued)

*Primary Examiner* — David Yi
*Assistant Examiner* — Craig S Goldschmidt
(74) *Attorney, Agent, or Firm* — Meyertons Hood Kivlin Kowert and Goetzel PC; Rory D. Rankin (57) ABSTRACT

Systems, apparatuses, and methods for implementing a hybrid memory module bridge network and buffers are disclosed. A system includes one or more host processors and multiple memory modules. Each memory module includes a relatively low pin count, high-bandwidth serial link to one or more other memory modules to perform inter-memory data transfers without consuming host-memory bandwidth. In one embodiment, a first memory module acts as a cache and a second memory module acts as the main memory for the system. The traffic between the host and the first memory module utilizes a first interface, and the cache traffic between the first and second memory modules utilizes a second interface. Cache line fill and writeback transfers between the first and second memory modules occur in parallel with timing-critical cache demand accesses from the host, in a latency-tolerant and buffered manner, without interfering with the cache demand accesses.

20 Claims, 5 Drawing Sheets

(56) References Cited

U.S. PATENT DOCUMENTS

| | | | |
|---|---|---|---|
| 5,553,263 A * | 9/1996 | Kalish | G06F 11/2017 711/120 |
| 6,034,878 A | 3/2000 | Osaka et al. | |
| 6,215,727 B1 | 4/2001 | Parson et al. | |
| 6,321,282 B1 | 11/2001 | Horowitz et al. | |
| 6,377,640 B2 | 4/2002 | Trans | |
| 6,480,946 B1 | 11/2002 | Tomishima et al. | |
| 6,502,161 B1 | 12/2002 | Perego et al. | |
| 6,516,282 B2 | 2/2003 | Hudlund et al. | |
| 6,640,309 B2 | 10/2003 | Doblar et al. | |
| 6,839,393 B1 | 1/2005 | Sidiropoulos | |
| 6,954,871 B2 | 10/2005 | Kuhn | |
| 7,003,684 B2 | 2/2006 | Chang | |
| 7,165,153 B2 | 1/2007 | Vogt | |
| 7,206,922 B1 * | 4/2007 | Steiss | G06F 9/3802 711/151 |
| 7,222,224 B2 | 5/2007 | Woo et al. | |
| 7,313,639 B2 | 12/2007 | Perego et al. | |
| 7,421,525 B2 | 9/2008 | Polzin et al. | |
| 2002/0035675 A1 * | 3/2002 | Freerksen | G06F 12/0831 711/151 |
| 2003/0070052 A1 | 4/2003 | Lai | |
| 2003/0200407 A1 | 10/2003 | Osaka et al. | |
| 2003/0231543 A1 | 12/2003 | Matsui | |
| 2004/0098545 A1 | 5/2004 | Pline et al. | |
| 2004/0230718 A1 | 11/2004 | Polzin et al. | |
| 2004/0236877 A1 | 11/2004 | Burton | |
| 2005/0166006 A1 | 7/2005 | Talbot et al. | |
| 2005/0226056 A1 * | 10/2005 | Hao | G06F 17/505 365/154 |
| 2005/0276261 A1 | 12/2005 | Kim et al. | |
| 2006/0034358 A1 | 2/2006 | Okamura | |
| 2007/0038831 A1 | 2/2007 | Kim et al. | |
| 2007/0109019 A1 | 5/2007 | Wu et al. | |
| 2007/0121389 A1 | 5/2007 | Wu et al. | |
| 2007/0162670 A1 | 7/2007 | Yang et al. | |
| 2008/0104352 A1 | 5/2008 | Talbot | |
| 2009/0198893 A1 * | 8/2009 | Sorgard | G06F 12/1027 711/118 |

FOREIGN PATENT DOCUMENTS

| | | |
|---|---|---|
| WO | 2004102403 A2 | 11/2004 |
| WO | 2006083899 A1 | 8/2006 |

OTHER PUBLICATIONS

Office Action in Japanese Patent Application No. 2009-535285, dated Aug. 29, 2012, 4 pages.

Office Action in German Patent Application No. 112007002605.7, dated Jun. 10, 2010, 7 pages.

* cited by examiner

HYBRID MEMORY MODULE BRIDGE NETWORK AND BUFFERS

This invention was made with Government support under (FastForward-2 Memory Technology (MT) Project with Lawrence Livermore National Laboratory) Prime Contract No. DE-AC52-07NA27344, Subcontract No. B608045 awarded by the United States Department of Energy. The United States Government has certain rights in this invention.

BACKGROUND

Description of the Related Art

Memory bandwidth has been increasing over recent history as a result of various technological and process innovations. However, the input/output (I/O) bandwidth of memory modules has not increased as rapidly as the internal bandwidth of the memory devices on the memory modules. Additionally, when ranks of memory modules are added to multi-drop buses in order to increase memory capacity, these memory modules end up sharing the I/O bandwidth of a single memory channel. These buses tend to have a relatively direct path to the memory arrays, but consume many pins and the protocols are not latency tolerant. In some multi-level memory systems, one memory subsystem acts as a cache for another memory subsystem. In some embodiments, these memories are connected together using a single channel. A channel is sometimes referred to as a bus, link, interface, or bus interface herein. Placing two memory modules on a single channel, where one of the memory modules is a cache, generates additional bandwidth due to cache misses, including frequent bus turnarounds which consumes even more cycles.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing a hybrid memory module bridge network and buffers are disclosed. In one embodiment, a computing system includes one or more host processors and multiple memory modules. In various embodiments, one or more memory modules act as caches and be coupled to the host processors over a low-latency memory bus interface. In some embodiments, these one or more memory modules also include high-bandwidth serial links to one or more other memory modules to perform inter-memory data transfers without consuming host-memory bandwidth.

In one embodiment, a first memory module is treated as a cache and a second memory module is treated as the main memory for the system. The traffic between the host and the first memory module traverses a first interface and the cache traffic between the first and second memory modules traverses a second interface. Accordingly, in some embodiments cache line fills and writebacks transfer between the first and second memory modules in parallel with timing-critical cache demand accesses from the host, in a latency-tolerant and buffered manner, without interfering with the cache demand accesses. Additionally, data copying between the first and second memory modules is performed efficiently without host involvement. In one embodiment, the first interface is a wide, low-latency interface and the second interface is a narrow, high-frequency, high-latency interface.

Each memory module includes one or more memory devices, a buffer chip, an arbiter, and multiple interfaces. The multiple interfaces include a wide, low-latency interface and one or more narrow, high-frequency, high-latency interface ports. The host is coupled to one or more memory modules via the wide, low-latency interface. In various embodiments, these one or more memory modules act as caches for the host. In one embodiment, the wide, low-latency interface is a double data rate synchronous dynamic random-access memory (DDR SDRAM) interface (e.g., DDR4 interface). In typical configurations, there will be higher internal memory bandwidth capacity potential on each memory module than a single DDR external bus is capable of sustaining. This higher internal memory bandwidth capacity is able to support additional interfaces and memory traffic without impacting performance for transfers on the single DDR external bus. In one embodiment, the narrow, high-frequency, high-latency interface ports are serializer/deserializer (SerDes) ports. Each memory module is connected to one or more other memory modules via the narrow, high-frequency, high-latency ports.

In one embodiment, the host processor requests the data via a first interface to the first memory module and the first memory module is configured to send a signal (referred to herein as a "retry" signal) to the host responsive to the host requesting data that is not stored in the first memory module. Additionally, the first memory module requests the targeted data from a second memory module via a second interface responsive to determining the targeted data is not stored in the first memory module. When the first memory module receives the targeted data from the second memory module, the first memory module sends the targeted data to the host when the host retries the request. In one embodiment, the first memory module includes a direct control path from the host to the physical memory devices on the first memory module. The direct control path includes an arbiter for arbitrating between requests received on the first and second interfaces. The arbiter is configured to forward memory requests received from the host directly to a targeted memory device responsive to determining no other conflicting operations are currently being performed to the targeted memory device.

Figure 1:
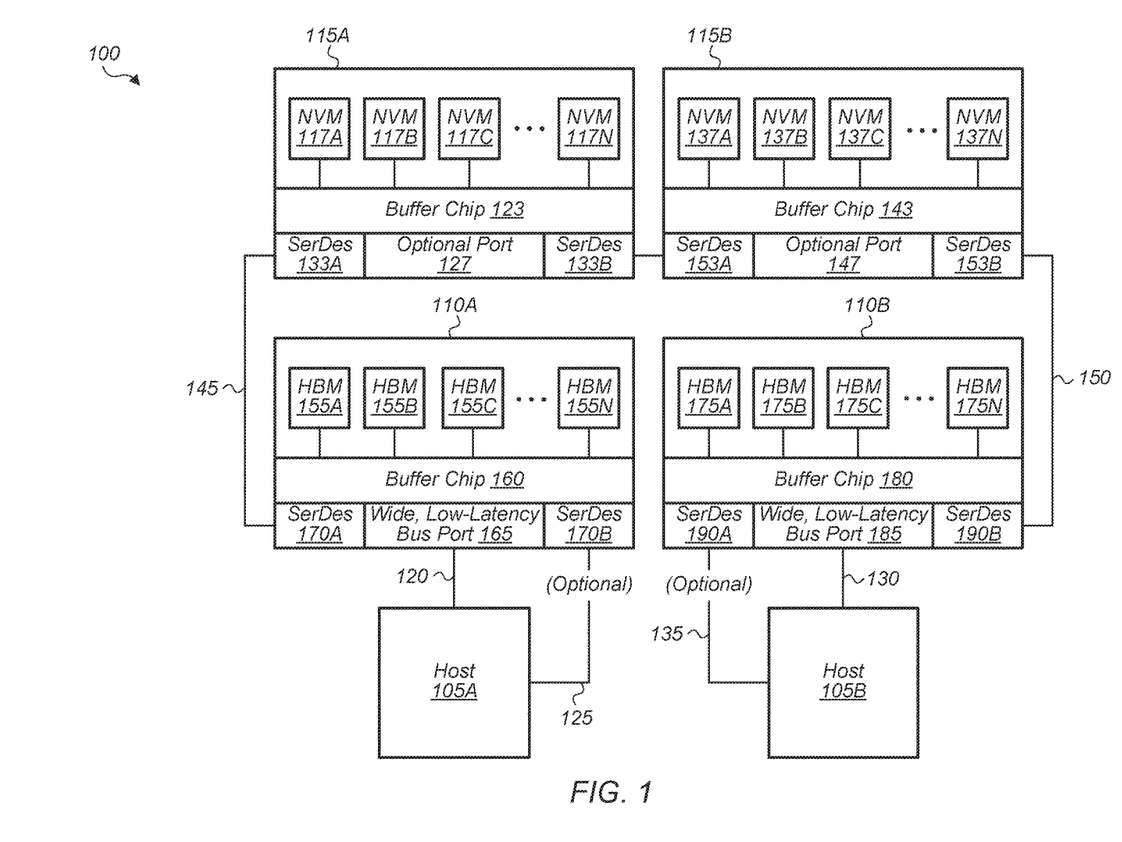
FIG. 1 is a block diagram of one embodiment of a computing system.

Referring now to FIG. 1, a block diagram of one embodiment of a computer system 100 is shown. System 100 includes hosts 105A-B, memory modules 110A-B, and memory modules 115A-B. In other embodiments, system 100 includes other numbers of hosts and memory modules. Hosts 105A-B are representative of any number and type of host processors (e.g., graphics processing unit (GPU), central processing unit (CPU)) with any number of cores.

Host 105A is coupled to memory module 110A via interface 120, and host 105A is optionally coupled to memory module 110A via interface 125. Similarly, host 105B is coupled to memory module 110B via interface 130, and host 105B is optionally coupled to memory module 110B via interface 135. In one embodiment, interface 120 and interface 130 are wide, low-latency bus interfaces. In various embodiments, interface 120 and interface 130 support the double data rate fourth generation (DDR4) protocol and additional protocols. In one embodiment, interfaces 125 and 135 are serializer/deserializer (SerDes) interfaces. In other embodiments, interfaces 125 and 135 are other types of interfaces. Host 105A is also optionally be coupled to host 105B in some embodiments via a coherent interconnect interface.

The processor(s) of hosts 105A-B are configured to execute the main control software of system 100, such as an operating system. Generally, software executed by the processor(s) of hosts 105A-B during use controls the other components of system 100 to realize the desired functionality of system 100. The processor(s) of hosts 105A-B also execute other software, such as application programs. The application programs provide user functionality, and generally rely on the operating system for lower level device control.

In one embodiment, memory modules 110A-B and 115A-B are dual in-line memory modules (DIMMs) having one or more SDRAMs, which are also called ranks. As shown in FIG. 1, memory module 110A includes memory devices 155A-N, which are representative of any number and type of memory devices. Memory devices 155A-N can also be referred to as memory chips (e.g., DRAM chips). In one embodiment, memory devices 155A-N are high bandwidth memory (HBM) chips. In other embodiments, memory devices 155A-N utilize any of various types of memory technologies, including random access memory (RAM), static RAM (SRAM), dynamic RAM (DRAM), Resistive RAM (ReRAM), Phase Change RAM (PCRAM), or any other volatile or non-volatile RAM. The type of DRAM used includes (but is not limited to) double data rate (DDR) DRAM, DDR2 DRAM, DDR3 DRAM, DDR4 DRAM, and so forth. Other types of memories can be used, and include high-speed CMOS, high-density DRAM, eDRAM, 3D stacked memory (e.g., stacked DRAM), interposer-based integrated memory, multi-chip modules (MCM), magneto-optical storage medium, read only memory (ROM), phase-change memory, spin-transfer torque magnetic RAM, memristor, extended data output (EDO) RAM, Rambus RAM, Rambus DRAM, erasable programmable memory (EEPROM), solid-state memory, hard disk drive, optical storage mediums, etc.

Memory module 110A also includes buffer chip 160, wide, low-latency bus port 165, and interfaces 170A-B. In one embodiment, interfaces 170A-B are SerDes interfaces. Similarly, memory module 110B includes memory chips 175A-N, buffer chip 180, wide, low-latency bus interface 185, and interfaces 190A-B. Memory modules 110A and 110B are also coupled to memory modules 115A and 115B, respectively, via links 145 and 150, respectively. In one embodiment, links 145 and 150 are SerDes links. Memory module 115A includes memory devices 117A-N, which are representative of any number and type of memory devices. In one embodiment, memory devices 117A-N are non-volatile memory (NVM) devices. Memory module 115A also includes buffer chip 123, an optional port 127, and SerDes ports 133A-B. Similarly, memory module 115B includes memory devices 137A-N, buffer chip 143, an optional port 147, and SerDes ports 153A-B.

In one embodiment, SerDes port 133B of memory module 115A is coupled to SerDes port 153A of memory module 115B. These SerDes ports are utilized to transfer data between memory module 115A and memory module 115B without host involvement. In one embodiment, SerDes port 133A of memory module 115A is coupled to SerDes port 170A of memory module 110A. Memory module 110A requests data from either of memory modules 115A-B via SerDes port 170A. For example, in response to a miss in memory devices 155A-N for a memory request generated by host 105A, memory module 110A generates a corresponding memory request for the memory module 115A or 115B and sends the memory request to memory module 115A or 115B via SerDes port 170A.

Similarly, SerDes port 153B of memory module 115B is coupled to SerDes port 190B of memory module 110B. Memory module 110B requests data from either of memory modules 115A-B via SerDes port 190B. It is noted that in other embodiments, other numbers of memory modules and other configurations of memory modules are utilized. For example, in some embodiments other numbers of memory modules are included in the second tier of memory. These memory modules are coupled to each other via SerDes ports in a similar fashion to memory modules 115A-B.

System 100 corresponds to any of various types of computer systems or computing devices, including, but not limited to, a personal computer system, desktop computer, laptop or notebook computer, supercomputer, mobile device, tablet, phone, smartphone, mainframe computer system, handheld computer, workstation, network computer, a consumer device, server, file server, application server, storage server, web server, cloud computing server, or in general any type of computing system or device. It is noted that the number of components of system 100 can vary from embodiment to embodiment. There can be more or fewer of each component/subcomponent than the number shown in FIG. 1. It is also noted that system 100 can include other components not shown in FIG. 1. Additionally, in other embodiments, system 100 can be structured in other ways than shown in FIG. 1.

Figure 2:
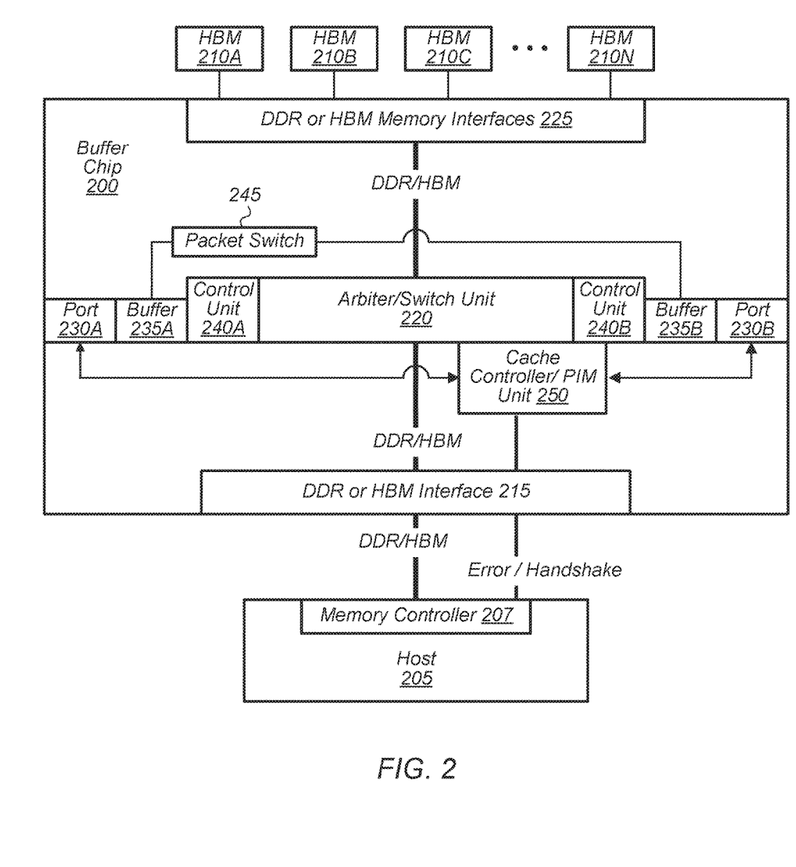
FIG. 2 is a block diagram of one embodiment of a buffer chip.

Turning now to FIG. 2, a block diagram of one embodiment of a buffer chip 200 is shown. In one embodiment, the contents of buffer chip 200 are included in buffer chips 113, 143, 160, and 180 (of FIG. 1). Buffer chip 200 is coupled to host 205 and memory devices 210A-N. In one embodiment, memory devices 210A-N are high bandwidth memory (HBM) devices. Host 205 includes memory controller 207 with logic for writing and reading to memory devices 210A-N. Memory controller 207 transmits multiple signals to memory devices 210A-N including address signals, control signals, clock signals, etc. to access data in memory devices 210A-N or to send data to memory devices 210A-N. In various embodiments, buffer chip 200 is located within a memory module (e.g., memory modules 110A-B or 115A-B of FIG. 1).

Buffer chip 200 includes interface 215 to host 205. In one embodiment, interface 215 is a DDR interface. In another embodiment, interface 215 is a HBM interface. In other embodiments, interface 215 is other than a DDR interface. Buffer chip 200 also includes arbiter/switch unit 220, memory interfaces 225, ports 230A-B, buffers 235A-B, control units 240A-B, packet switch 245, and cache controller/processing-in-memory (PIM) unit 250. In one embodiment, arbiter/switch unit 220 is configured to arbitrate between a packet-based interface (e.g., ports 230A-B) and a fixed-timing interface (e.g., interface 215).

In one embodiment, ports 230A-B are coupled to other memory modules via SerDes links. Serial data is sent to and received from other memory modules via ports 230A-B without host involvement. When data is received on port 230A, the data is deserialized and buffered in buffer 235A. Similarly, when data is received on port 230B, the data is deserialized and buffered in buffer 235B. When data received on either of ports 230A-B targets a different memory module than the memory module which includes buffer chip 200, packet switch 245 transfers the data between buffers 235A-B without the data passing through arbiter/switch unit 220. The data is then transferred to the adjacent memory module.

When data received on ports 230A-B targets the memory devices 210A-N, the data is deserialized and buffered in a corresponding buffer 235A-B. Then, the data is passed through a corresponding control logic unit 240A-B to arbiter/switch unit 220. Arbiter/switch unit 220 is configured to arbitrate between requests received on ports 230A-B with requests received from host 205 on interface 215. In one embodiment, requests received from host 205 on interface 215 are processed with a higher priority than requests received on ports 230A-B. As long as no other requests are being processed on a memory channel targeted by a request received from host 205, the request signals received on interface 215 are coupled directly through to the targeted memory device 210A-N. In other embodiments, buffer chip 200 includes other logic and/or is arranged in different configurations.

Figure 3:
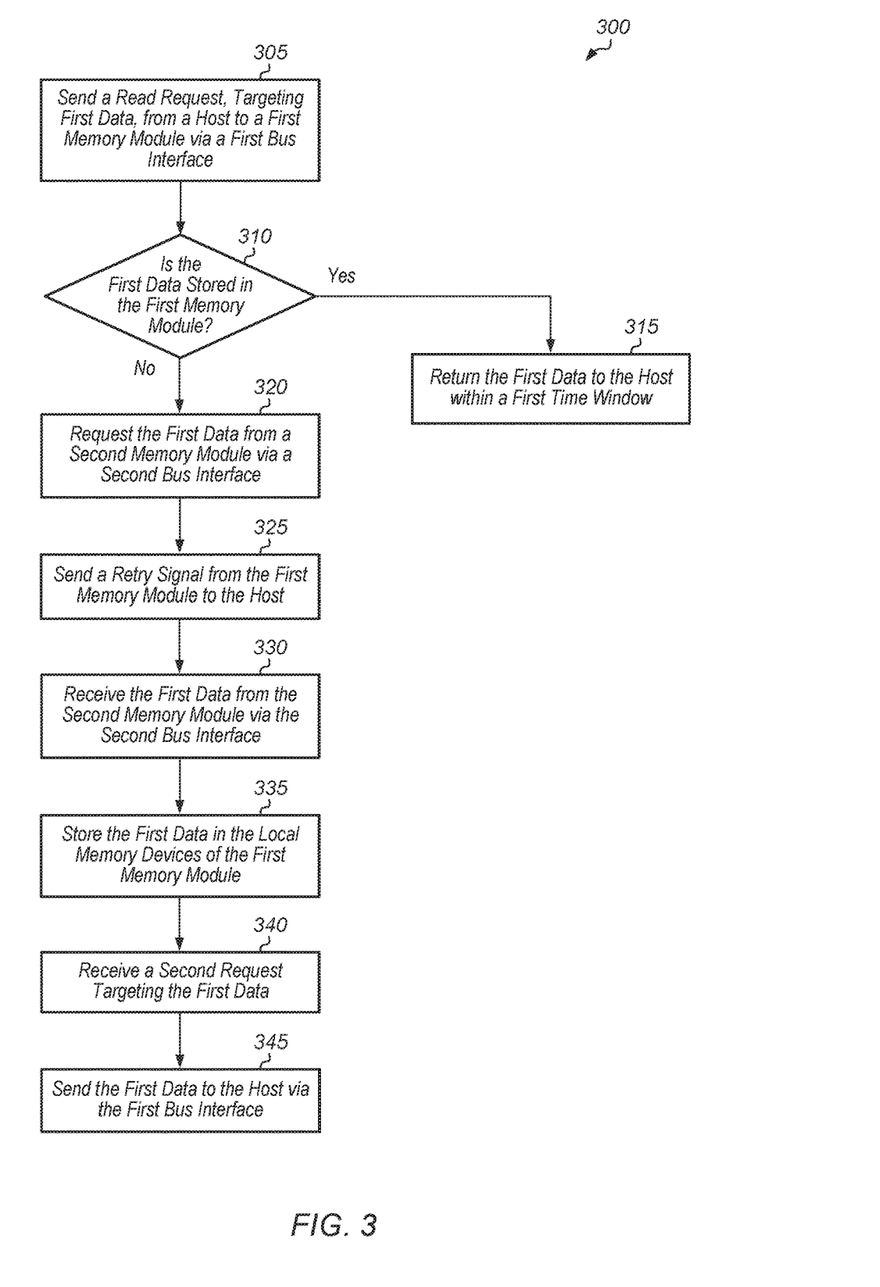
FIG. 3 is a generalized flow diagram illustrating one embodiment of a method for processing a memory request in a memory module with hybrid interfaces.
Figure 4:
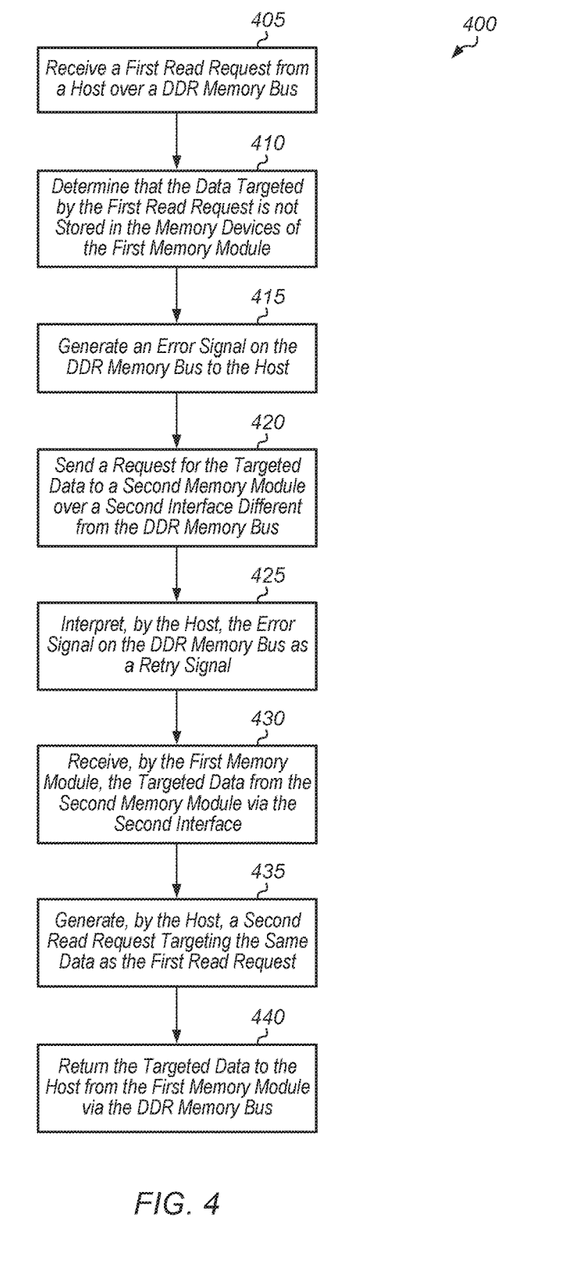
FIG. 4 is a generalized flow diagram illustrating another embodiment of a method for utilizing an error signal on a fixed-timing memory bus interface.
Figure 5:
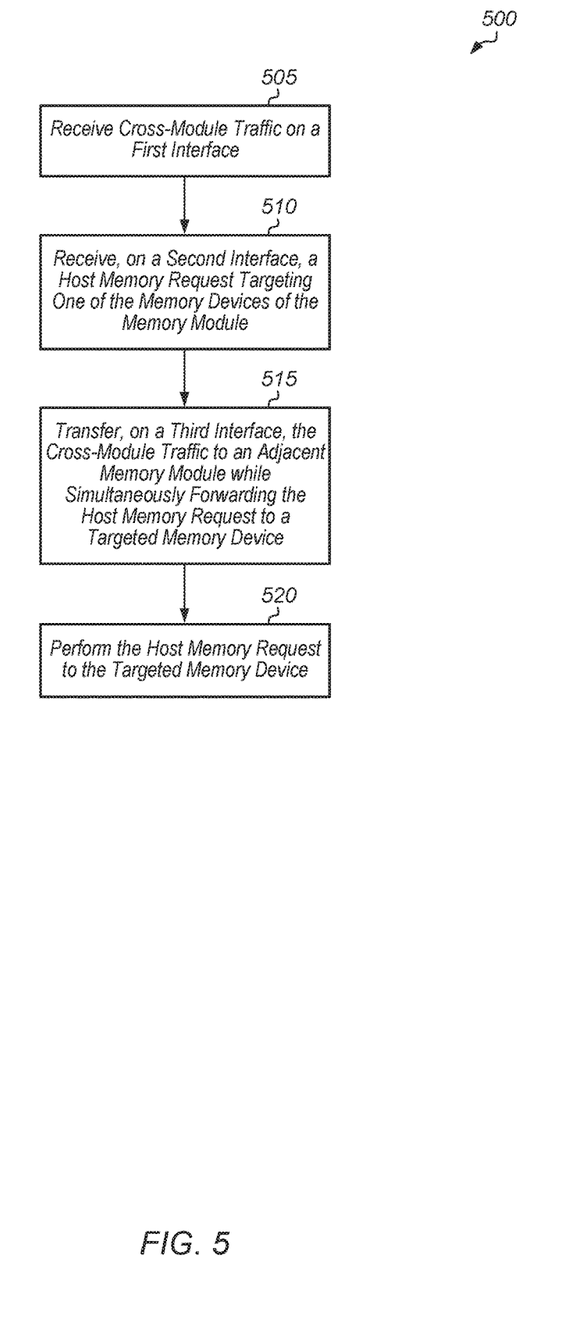
FIG. 5 is a generalized flow diagram illustrating one embodiment of a method for simultaneously processing multiple requests in a memory module with hybrid interfaces.

Referring now to FIG. 3, one embodiment of a method 300 for processing a memory request in a memory module with hybrid interfaces is shown. For purposes of discussion, the steps in this embodiment and those of FIGS. 4-5 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 300.

A host sends a read request, targeting first data, to a first memory module via a first bus interface (block 305). The first memory module includes one or more memories, which can also be referred to as ranks. In one embodiment, the first bus interface is a fixed-timing interface. If the first data is stored in the first memory module (conditional block 310, "yes" leg), then the first memory module returns the first data to the host within a first time window (block 315). In various embodiments, the first time window is a predetermined amount of time determined by a specification for the first bus interface. If the first data is not stored in the first memory module (conditional block 310, "no" leg), then the first memory module requests the first data from a second memory module via a second bus interface (block 320). In one embodiment, the second bus interface is a packet-based interface. In one embodiment, the second bus interface is a higher latency bus interface as compared to the latency of the first bus interface. In one embodiment, the second bus interface is a SerDes link.

The first memory module also sends a retry signal to the host (block 325). In one embodiment, the first memory module sends, on the first bus interface, an error signal to the host which the host interprets as a retry signal. In another embodiment, the retry signal is sent on a sideband interface which is not part of the first bus interface. It is noted that in various embodiments blocks 320 and 325 are performed in parallel, block 325 is performed prior to block 320, or block 320 is performed prior to block 325, depending on the embodiment.

Then, at a later point in time, the first memory module receives the first data from the second memory module via the second bus interface (block 330). In embodiments where the first memory module is being used as a cache, the first data is stored in the local memory devices of the first memory module (block 335). In embodiments where a "flat" memory addressing scheme is used, where first and second memories are allocated different address ranges, data requested from the second memory does not have to be written (cached) into the first one. Rather, it can be stored in a temporary buffer instead. Then, the first memory module receives, from the host, a second request targeting the first data (block 340). The second request from the host is generated by the host in response to the host receiving the retry signal generated in block 325. In one embodiment, the host waits a programmable amount of time between the first and second read requests in response to receiving the retry signal. Next, the first memory module fulfills the second request by sending the first data to the host via the first bus interface (block 345). After blocks 315 and 345, method 300 ends.

Turning now to FIG. 4, one embodiment of a method 400 for utilizing an error signal on a fixed-timing memory bus interface is shown. In the example shown, a first memory module receives a first read request from a host over a DDR memory bus (block 405). In other embodiments, the first read request is sent from the host to the first memory module using any of various other types of interfaces. It is assumed for the purposes of this discussion that the first memory module determines that the data targeted by the first read request is not stored in the memory devices of the first memory module (block 410). In response to determining that the data targeted by the first read request is not stored in the memory devices of the first memory module, the memory module generates an error signal on the DDR memory bus to the host (block 415). Additionally, in response to determining that the data targeted by the first read request is not stored in the memory devices of the first memory module, the first memory module also sends a request for the targeted data to a second memory module over a second interface different from the DDR memory bus (block 420). In one embodiment, the second interface is a SerDes link.

In response to detecting the error signal on the DDR memory bus, the host interprets the error signal as a retry signal (block 425). At a later point in time, the first memory module receives the targeted data from the second memory module via the second interface (block 430). Also, at a later point in time, the host generates a second read request targeting the same data as the first read request (block 435). This time, the first memory module returns the targeted data to the host via the DDR memory bus (block 440). After block 440, method 400 ends.

Referring now to FIG. 5, one embodiment of a method 500 for simultaneously processing multiple requests in a memory module with hybrid interfaces is shown. A memory module receives cross-module traffic on a first interface (block 505). In one embodiment, the first interface is a SerDes interface. In other embodiments, the first interface is a different type of interface. The cross-module traffic refers to a request that targets one of the other memory modules in the system.

Simultaneous to receiving the cross-module traffic, the memory module receives, on a second interface, a host memory request targeting one of the memory devices of the memory module (block 510). In one embodiment, the second interface is a DDR interface. In other embodiments, the second interface is a different type of interface.

The memory module transfers, on a third interface, the cross-module traffic to an adjacent memory module while simultaneously forwarding the host memory request to a targeted memory device (block 515). In one embodiment, the third interface port is a SerDes interface. In other embodiments, the third interface port is a different type of interface. The host memory request is then performed to the targeted memory device (block 520). After block 520, method 500 ends.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
a first memory module;
a second memory module coupled to the first memory module via a first interface; and
a host processor coupled to the first memory module via a second interface different from the first interface, wherein the host processor is configured to cache data in the first memory module, and wherein the first memory module is external to the host processor;
wherein the system is configured to:
transfer data between the host processor and the first memory module via the second interface;
transfer data between the first memory module and the second memory module via the first interface without consuming bandwidth on the second interface; and
send a retry signal from the first memory module to the host processor responsive to the host processor requesting data that is not stored in the first memory module, wherein the retry signal causes the host processor to resend a request to the first memory module at a later point in time.

2. The system as recited in claim 1, wherein the system is further configured to:
perform cache line fills and writeback transfers between the first memory module and the second memory module in parallel with cache demand accesses from the host processor to the first memory module; and
perform cache line fills and writeback transfers between the first memory module and the second memory module without involvement of the host processor.

3. The system as recited in claim 1, wherein the host processor is configured to wait a programmable amount of time before resending a request to the first memory module in response to receiving the retry signal.

4. The system as recited in claim 1, wherein:
the first memory module is coupled to a third memory module;
data is transferred between the first memory module and the third memory module via a third interface while simultaneously forwarding a memory request from the host processor to a targeted memory device on the first memory module, wherein the third interface is a different interface from the second interface; and
the first and third interfaces are same types of interfaces.

5. The system as recited in claim 1, wherein:
the second interface is a double data rate dynamic random-access memory (DDR DRAM) interface; and
the first interface is a serializer/deserializer (SerDes) interface.

6. The system as recited in claim 1, wherein:
the first memory module is treated as a cache; and
the second memory module is treated as main memory for the system.

7. The system as recited in claim 1, wherein the system is further configured to send an error signal from the first memory module to the host processor responsive to the host processor requesting data that is not stored in the first memory module, wherein the host processor interprets the error signal as the retry signal.

8. A method comprising:
transferring data between a host processor and a first memory module via a second interface, wherein the first memory module is external to the host processor;
transferring data between the first memory module and a second memory module via a first interface without consuming bandwidth on the second interface;
caching data in the first memory module by the host processor; and
sending a retry signal from the first memory module to the host processor responsive to the host processor requesting data that is not stored in the first memory module, wherein the retry signal causes the host processor to resend a request to the first memory module at a later point in time.

9. The method as recited in claim 8, further comprising:
performing cache line fills and writeback transfers between the first memory module and the second memory module in parallel with cache demand accesses from the host processor to the first memory module; and
performing cache line fills and writeback transfers between the first memory module and the second memory module without involvement of the host processor.

10. The method as recited in claim 8, further comprising the host processor waiting a programmable amount of time before resending a request to the first memory module in response to receiving the retry signal, wherein the first interface is a fixed-timing interface, and wherein the second interface is a packet-based interface.

11. The method as recited in claim 8, wherein the first memory module is coupled to a third memory module and the method further comprises:
transferring data between the first memory module and the third memory module via a third interface while simultaneously forwarding a memory request from the host processor to a targeted memory device on the first memory module, wherein the third interface is a different interface from the second interface, and wherein the first and third interfaces are same types of interfaces.

12. The method as recited in claim 8, wherein:
the first second interface is a double data rate dynamic random-access memory (DDR DRAM) interface; and
the first interface is a serializer/deserializer (SerDes) interface.

13. The method as recited in claim 8, wherein:
the first memory module is treated as a cache; and
the second memory module is treated as main memory for the system.

14. The method as recited in claim 8, further comprising sending an error signal from the first memory module to the host processor responsive to the host processor requesting data that is not stored in the first memory module, wherein the host processor interprets the error signal as the retry signal.

15. An apparatus comprising:
a plurality of memory devices; and
a plurality of interfaces;
wherein the apparatus is configured to:
transfer data with a host processor via a second interface of the plurality of interfaces, wherein the apparatus is external to the host processor;
transfer data with a first memory module via a first interface of the plurality of interfaces without consuming bandwidth on the second interface;
act as a cache for the host processor; and
send a retry signal to the host processor responsive to the host processor requesting data that is not stored in the plurality of memory devices, wherein the retry signal causes the host processor to resend a request to the apparatus at a later point in time.

16. The apparatus as recited in claim 15, wherein the apparatus is further configured to perform cache line fills and writeback transfers with the first memory module without involvement of the host processor and in parallel with cache demand accesses from the host processor.

17. The apparatus as recited in claim 15, wherein the host processor is configured to wait a programmable amount of time before resending a request to the first memory module in response to receiving the retry signal.

18. The apparatus as recited in claim 15, wherein the apparatus is coupled to a second memory module, wherein the apparatus is configured to transfer data with the second memory module using a third interface while simultaneously forwarding a memory request from the host processor to a targeted memory device on the first memory module, wherein the third interface is a different interface from the second interface, and wherein the first and third interfaces are same types of interfaces.

19. The apparatus as recited in claim 15, wherein the second interface is a double data rate dynamic random-access memory (DDR DRAM) interface, and wherein the first interface is a serializer/deserializer (SerDes) interface.

20. The apparatus as recited in claim 15, wherein the apparatus is treated as a cache, and wherein the first memory module is treated as main memory for the host processor.

* * * * *

UNITED STATES PATENT AND TRADEMARK OFFICE
CERTIFICATE OF CORRECTION

PATENT NO. : 10,095,421 B2
APPLICATION NO. : 15/331582
DATED : October 9, 2018
INVENTOR(S) : Roberts et al.

Page 1 of 1

It is certified that error appears in the above-identified patent and that said Letters Patent is hereby corrected as shown below:

In the Claims

Column 9, Claim 12, Line 20, please delete "the first second interface" and substitute -- the second interface --.

Signed and Sealed this
Twenty-ninth Day of January, 2019

Andrei Iancu
*Director of the United States Patent and Trademark Office*